US010698318B2

(12) United States Patent
Seitz et al.

(10) Patent No.: US 10,698,318 B2
(45) Date of Patent: Jun. 30, 2020

(54) METHOD AND DEVICE FOR CHARACTERIZING A MASK FOR MICROLITHOGRAPHY

(71) Applicant: Carl Zeiss SMT GmbH, Oberkochen (DE)

(72) Inventors: Holger Seitz, Jena (DE); Ute Buttgereit, Jena (DE); Thomas Thaler, Jena (DE); Thomas Frank, Jena (DE); Ulrich Matejka, Jena (DE); Markus Deguenther, Florstadt (DE); Robert Birkner, Jena (DE); Dominik Grau, Apolda (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/026,675

(22) Filed: Jul. 3, 2018

(65) Prior Publication Data

US 2019/0011839 A1  Jan. 10, 2019

(30) Foreign Application Priority Data

Jul. 7, 2017 (DE) .......................... 10 2017 115 262

(51) Int. Cl.
*G03F 7/20* (2006.01)
*G03F 1/00* (2012.01)
(Continued)

(52) U.S. Cl.
CPC ........ *G03F 7/70133* (2013.01); *G03F 1/0092* (2013.01); *G03F 1/84* (2013.01);
(Continued)

(58) Field of Classification Search
CPC ...... G03F 1/0092; G03F 1/84; G03F 7/70091; G03F 7/70125; G03F 7/70133;
(Continued)

(56) References Cited

U.S. PATENT DOCUMENTS 6,855,486 B1 *  2/2005  Finders ............... G03F 7/70425
                                              355/53
2005/0243222 A1 * 11/2005  Maul ................... G02B 5/3083
                                              349/5

(Continued)

FOREIGN PATENT DOCUMENTS

DE  102004033602  2/2006  ............ G01M 11/00
DE  102004033603  2/2006  ............ G01M 11/00
(Continued)

OTHER PUBLICATIONS

German Office Action for German Application No. 10 2017 115 262.8 dated Feb. 20, 2018.
(Continued)

*Primary Examiner* — Colin W Kreutzer
(74) *Attorney, Agent, or Firm* — Fish & Richardson P.C.

(57) ABSTRACT

The invention relates to a method and a device for characterizing a mask for microlithography. In a method according to the invention, structures of a mask intended for use in a lithography process in a microlithographic projection exposure apparatus are illuminated by an illumination optical unit, wherein the mask is imaged onto a detector unit by an imaging optical unit, wherein image data recorded by the detector unit are evaluated in an evaluation unit. In this case, for emulating an illumination setting predefined for the lithography process in the microlithographic projection exposure apparatus, the imaging of the mask onto the detector unit is carried out in a plurality of individual imagings which differ from one another with regard to the illumination setting set in the illumination optical unit or the polarization-influencing effect set in the imaging optical unit.

19 Claims, 6 Drawing Sheets

(51) Int. Cl.
*G03F 1/84* (2012.01)
*G01N 21/956* (2006.01)

(52) U.S. Cl.
CPC ........ *G03F 7/7085* (2013.01); *G03F 7/70091* (2013.01); *G03F 7/70125* (2013.01); *G03F 7/70516* (2013.01); *G03F 7/70566* (2013.01); *G03F 7/70591* (2013.01); *G01N 2021/95676* (2013.01)

(58) Field of Classification Search
CPC .. G03F 7/705; G03F 7/70516; G03F 7/70566; G03F 7/70591; G01N 2021/95676
USPC .......................................... 355/67, 68, 71, 77
See application file for complete search history.

(56) References Cited

U.S. PATENT DOCUMENTS

| | | | |
|---|---|---|---|
| 2006/0007541 A1 | 1/2006 | Totzeck et al. | |
| 2006/0012873 A1 | 1/2006 | Totzeck et al. | |
| 2006/0072095 A1* | 4/2006 | Kudo | G03B 27/42 355/67 |
| 2007/0031744 A1* | 2/2007 | Crouse | G03F 7/701 430/30 |
| 2008/0259300 A1* | 10/2008 | Klaassen | G03F 7/70108 355/53 |
| 2008/0297775 A1 | 12/2008 | Greif-Wustenbecker et al. | |
| 2009/0135397 A1* | 5/2009 | Fiolka | G03F 7/70108 355/71 |
| 2009/0168038 A1 | 7/2009 | Akamatsu | |
| 2009/0168040 A1* | 7/2009 | Toyama | G02B 5/18 355/71 |
| 2009/0262324 A1* | 10/2009 | Patra | G03F 7/70116 355/68 |
| 2009/0323042 A1* | 12/2009 | Totzeck | G03F 7/70566 355/71 |
| 2011/0090329 A1 | 4/2011 | Poortinga et al. | |
| 2011/0149261 A1* | 6/2011 | Saenger | G02B 5/30 355/71 |
| 2012/0194794 A1* | 8/2012 | Tychkov | G03F 7/70116 355/67 |
| 2013/0335552 A1 | 12/2013 | Feldmann et al. | |
| 2014/0055788 A1 | 2/2014 | Den Boef et al. | |
| 2015/0001408 A1 | 1/2015 | Frank et al. | |
| 2018/0364472 A1* | 12/2018 | Ogawa | G02B 21/367 |

FOREIGN PATENT DOCUMENTS

| | | | |
|---|---|---|---|
| DE | 102005062237 | 7/2007 | .............. G03F 7/20 |
| DE | 102007009661 | 3/2008 | .............. G02B 27/50 |
| DE | 102009038558 | 3/2011 | .............. G03F 7/20 |
| DE | 102010063337 | 6/2012 | .............. G03F 1/00 |
| DE | 102011113940 | 3/2013 | .............. G03F 7/20 |
| DE | 102011085334 | 5/2013 | .............. G02B 27/28 |
| DE | 102013212613 | 12/2014 | .............. G03F 7/20 |
| DE | 102013107976 | 1/2015 | .............. G01B 11/03 |
| EP | 1 615 062 | 1/2006 | .............. G02B 21/00 |
| KR | 1020130019384 | 2/2013 | .............. G03F 7/20 |
| TW | 200941147 | 10/2009 | .............. G03F 7/20 |
| WO | WO 2011/120821 | 10/2011 | .............. G03F 7/20 |
| WO | WO 2013/060561 | 5/2013 | .............. G03F 7/20 |
| WO | WO 2016/096351 | 6/2016 | .............. G03F 7/20 |

OTHER PUBLICATIONS

The Taiwan Office Action and Search Report for Taiwan Application No. 107120049 dated Dec. 28, 2018.
The Notice of Reasons for Rejection from the Korean Intellectual Property Office for Korean Application No. KR 10-2018-0077754 dated Jan. 20, 2020 (with English Translation).

* cited by examiner

METHOD AND DEVICE FOR CHARACTERIZING A MASK FOR MICROLITHOGRAPHY

CROSS REFERENCE TO RELATED APPLICATIONS

This application claims priority of German Patent Application DE 10 2017 115 262.8, filed on Jul. 7, 2017. The content of this application is hereby incorporated by reference.

TECHNICAL FIELD

The invention relates to a method and a device for characterizing a mask for microlithography. The invention is applicable both to finding defects and in further applications for characterizing the structures on a mask, for instance position determination or determining the line width of the structures (CD="critical dimension") and ascertaining process windows (e.g., by determining the line width depending on dose and defocus).

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by way of the illumination device is in this case projected by way of the projection lens onto a substrate (e.g., a silicon wafer) coated with a light-sensitive layer (photoresist) and arranged in the image plane of the projection lens, in order to transfer the mask structure to the light-sensitive coating of the substrate.

In the lithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. Therefore, there is a need to measure or to qualify the mask rapidly and simply, to be precise as far as possible under the same conditions such as are really present in the projection exposure apparatus.

For this purpose, it is known, in a mask inspection apparatus, to record and evaluate an aerial image of a segment of the mask. For recording the aerial image, in this case the structures to be measured on the mask are illuminated by an illumination optical unit, wherein the light coming from the mask is projected via an imaging optical unit onto a detector unit and detected.

In order to carry out the measurement of the mask if possible under conditions analogous to those in the projection exposure apparatus, in the mask inspection apparatus the mask is typically illuminated in a manner identical to that in the projection exposure apparatus, wherein in particular the same wavelength, the same numerical aperture and also the identical (if appropriately polarized) illumination setting are set in the mask inspection apparatus.

However, in practice a problem results from the fact that in the imaging optical unit of the mask inspection apparatus, the imaging of the mask onto the detector unit—unlike the imaging on the wafer that is carried out in the projection exposure apparatus—does not take place in reduced fashion, but rather in greatly magnified fashion. The thus greatly different numerical aperture present in the respective projection or imaging optical unit (said numerical aperture being almost zero in the imaging optical unit of the mask inspection apparatus) has the consequence that the imaging on the wafer that takes place in the lithography process differs significantly from the imaging onto the detector unit that takes place in the mask inspection apparatus with regard to vector effects that occur. In this case, "vector effect" should be understood to mean the polarization dependence of the interference of the electromagnetic radiation that takes place in the respective image plane.

In order to take account of the above problem and to determine the vector effects that occur in the microlithographic projection exposure apparatus and to take them into account in the aerial image generation, it is known, in particular, to carry out a plurality of individual imagings with the mask inspection apparatus, during which individual imagings different polarization-optical components are positioned in the illumination and/or imaging optical unit and the correspondingly generated images are combined with one another and subjected to computation. However, the procedure described above requires a comparatively high time expenditure.

With respect to the prior art, reference is made merely by way of example to DE 10 2004 033 603 A1, DE 10 2004 033 602 A1, DE 10 2005 062 237 A1, DE 10 2007 009 661 A1 and EP 1 615 062 B1.

SUMMARY

In a general aspect, the present invention provides a method and a device for characterizing a mask for microlithography which enable a faster and simplified measurement taking account of the conditions given in the lithography process including the vector effects that occur there.

In a method according to the invention for characterizing a mask for microlithography, structures of a mask intended for use in a lithography process in a microlithographic projection exposure apparatus are illuminated by an illumination optical unit, wherein the mask is imaged onto a detector unit by an imaging optical unit, and wherein image data recorded by the detector unit are processed in an evaluation unit.

In accordance with one aspect of the invention, the method is characterized in that for emulating an illumination setting predefined for the lithography process in the microlithographic projection exposure apparatus, the imaging of the mask onto the detector unit is carried out in a plurality of individual imagings which differ from one another with regard to the (illumination) setting set in the illumination optical unit.

The invention is based on the concept, in particular, during mask inspection, of determining the vector effects that occur in the later lithography process in the microlithographic projection exposure apparatus with a significantly reduced measurement complexity and in a comparatively short time by the polarized setting that is desired or predefined in the lithography process being "decomposed" in a suitable manner insofar as mutually different illumination settings each having an advantageous (e.g. constantly linear) polarization distribution are set in the illumination optical unit of the mask inspection apparatus.

In this case, these ("sub-")illumination settings set in the illumination optical unit of the mask inspection apparatus are chosen in such a way that upon superimposition with one another they at least approximately yield the predefined polarized illumination setting desired in the lithography process.

With this approach the invention makes use of the circumstance that the vector effect calculation known per se and described in the introduction can be carried out significantly more simply and faster if the polarized illumination setting to be taken into account in each case with regard to the vector effect is an illumination setting having a constantly linear polarization direction. This approach is based on the assumption, which as a rule is fulfilled to a good approximation, that a constant polarization direction present in the illumination optical unit is no longer significantly altered by the downstream mask and the imaging optical unit in the mask inspection apparatus.

The invention thus includes in particular a departure from conventional approaches in which in each case in the mask inspection apparatus the polarized illumination setting predefined in the actual lithography process is set identically. Rather, according to the invention, suitable polarized illumination settings are set in a targeted manner in the illumination optical unit of the mask inspection apparatus, which illumination settings differ from the polarized illumination setting desired or predefined in the lithography process, but in return enable a faster and simplified calculation of the vector effects to be expected in the lithography process. Advantageously, these are chosen such that the sum of the set illumination settings in terms of the light distribution and the polarization approximately or exactly corresponds to the illumination setting predefined in the actual lithography process.

In accordance with one embodiment, the illumination settings set in the illumination optical unit each have a constantly linear polarization distribution.

In accordance with one embodiment, the illumination setting to be set in the microlithographic projection exposure apparatus has a quasi-tangential polarization distribution.

In accordance with one embodiment, the illumination setting to be set in the microlithographic projection exposure apparatus is a quadrupole illumination setting or an annular illumination setting.

In accordance with one embodiment, the plurality of individual imagings are carried out without modification of the imaging optical unit.

In accordance with one embodiment, the illumination setting set in the illumination optical unit has a polarization distribution which at least approximately corresponds to the polarization distribution of the illumination setting predefined in the actual lithography process (e.g. x-polarization in first regions of the illumination pupil and y-polarization in second regions of the illumination pupil). The illumination setting used in the respective exposure steps can then be varied by illuminating respectively selected regions of the illumination pupil (advantageously, in an exposure step this involves illuminating all regions with corresponding polarization) and darkening the remaining regions. Consequently, if appropriate, it is necessary to change only the brightness distribution of the illumination, but not the polarization distribution set in the illumination optical unit.

In accordance with one embodiment, different illumination settings for the individual imagings are set by regions of a polarization-influencing optical element arranged in the illumination optical unit, from which regions light passes to the mask during the respective individual imaging, being chosen to be different from one another for the individual imagings.

In embodiments of the invention, the brightness distribution can be changed by exchanging or moving or displacing at least one stop.

In further embodiments of the invention, the brightness distribution can be changed using a micromirror array. This has the advantage that the brightness distribution can be changed particularly rapidly.

In accordance with one embodiment, different illumination settings are set or the brightness distribution is changed for the individual imagings in the illumination optical unit by exchanging or displacing stops.

In accordance with a further embodiment, different illumination settings are set or the brightness distribution is changed for the individual imagings in the illumination optical unit using a mirror arrangement comprising a multiplicity of mirror elements that can be set independently of one another. In further embodiments, according to the invention, an actively shapable light source (e.g. using LCDs or LEDs) can also be used for setting different illumination settings or for changing the brightness distribution for the individual imagings.

In accordance with a further embodiment, an illumination setting is set which approximately or exactly corresponds to the polarized illumination setting predefined in the actual lithography process (e.g. x-polarization in first regions of the illumination pupil and y-polarization in second regions of the illumination pupil). In addition, a linear polarizer can then be introduced into the illumination beam path, wherein e.g. only the x-polarized portions of the light pass to the mask in one exposure step and only the y-polarized portions of the light pass to the mask in a further exposure step. Consequently, the plurality of individual imagings are carried out without modification of the imaging optical unit and without modification of the "actual" illumination optical unit.

In accordance with a further embodiment, the mask is illuminated with an identical polarized illumination setting during all the individual imagings (e.g. x-polarization in first regions of the illumination pupil and y-polarization in second regions of the illumination pupil). A respective linear polarizer can then be introduced into the imaging beam path, wherein e.g. only the x-polarized portions of the light pass to the detector in one exposure step and only the y-polarized portions of the light pass to the detector in a further exposure step. Consequently, the plurality of individual imagings are carried out without modification of the illumination optical unit.

In accordance with one embodiment, the mask is illuminated with a polarized illumination setting which approximately or exactly corresponds to the polarized illumination setting predefined in the actual lithography process (e.g. x-polarization in first regions of the illumination pupil and y-polarization in second regions of the illumination pupil). In the imaging beam path there is positioned a suitable optical element (e.g. polarization beam splitter cube, Rochon prism or Wollaston prism), which e.g. directs the x-polarized portions of the light onto a first detector and directs the y-polarized portions of the light onto a second detector or onto a different region of the first detector. Consequently, the plurality of individual imagings are carried out without modification of the illumination optical unit and with only a single exposure. Even though reference has been made respectively to "x-polarization" and "y-polarization" in the embodiments described above, the invention is not restricted thereto, but rather is also applicable to other mutually different polarization distributions in first and respectively second regions of the illumination pupil.

In accordance with one embodiment, during the evaluation of the image data recorded by the detector unit during the individual imagings, a conversion of said image data is carried out in each case, during which conversion said image data are subjected to a polarization-dependent weighting. In this case, the polarization dependence of the interference of electromagnetic radiation that takes place during the operation of the microlithographic projection exposure apparatus at the wafer level (vector effect) can be taken into account for the illumination setting set during the individual imaging.

In accordance with one embodiment, the image data recorded by the detector unit during the individual imagings, following said conversion, are added, added in weighted fashion, averaged or averaged in weighted fashion. Various ways for performing the weighting are disclosed in, e.g., U.S. published patent application 20060012873.

In accordance with a further aspect, the invention also relates to a method for characterizing a mask for microlithography, wherein structures of a mask intended for use in a lithography process in a microlithographic projection exposure apparatus are illuminated by an illumination optical unit and wherein the mask is imaged onto at least one detector unit by an imaging optical unit, wherein image data recorded by the detector unit are evaluated in an evaluation unit, wherein for emulating an illumination setting predefined for the lithography process in the microlithographic projection exposure apparatus, the imaging of the mask onto the at least one detector unit is carried out in a plurality of individual imagings which differ from one another with regard to the illumination setting set in the illumination optical unit or the polarization-influencing effect of the imaging optical unit;

wherein during the evaluation of the image data recorded by the at least one detector unit during the individual imagings, a conversion of said image data is carried out in each case, during which conversion said image data are subjected to a polarization-dependent weighting; and wherein the image data recorded by the at least one detector unit during the individual imagings, following said conversion, are added, added in weighted fashion, averaged or averaged in weighted fashion.

In this case, too, during the conversion of the image data, the polarization dependence of the interference of electromagnetic radiation that takes place during the operation of the microlithographic projection exposure apparatus at the wafer level (vector effect) can be taken into account for the illumination setting set during the individual imaging.

In this case, the wording that individual imagings differ from one another with regard to the illumination setting set in the illumination optical unit should be understood to also encompass scenarios with individual imagings in which the respective illumination settings have mutually different polarization distributions with the same intensity distribution.

In accordance with one embodiment, at least two mutually different detector units or at least two different regions of a detector unit are used for recording the image data during the individual imagings.

In accordance with one embodiment, in this case light portions of different polarization properties are recorded simultaneously by at least two mutually different detector units or by at least two different regions of a detector unit.

The invention furthermore relates to a device for characterizing a mask for microlithography, comprising an illumination optical unit for illuminating structures on the mask, a detector unit, an imaging optical unit for imaging the mask onto the detector unit, and an evaluation unit for evaluating the image data recorded by the detector unit, wherein the device is configured to carry out a method having the features described above.

With regard to advantages and preferred configurations of the device, reference is made to the above explanations in association with the method according to the invention.

Further configurations of the invention can be gathered from the description and the dependent claims.

The invention is explained in greater detail below on the basis of exemplary embodiments illustrated in the accompanying figures.

DETAILED DESCRIPTION

Figure 6:
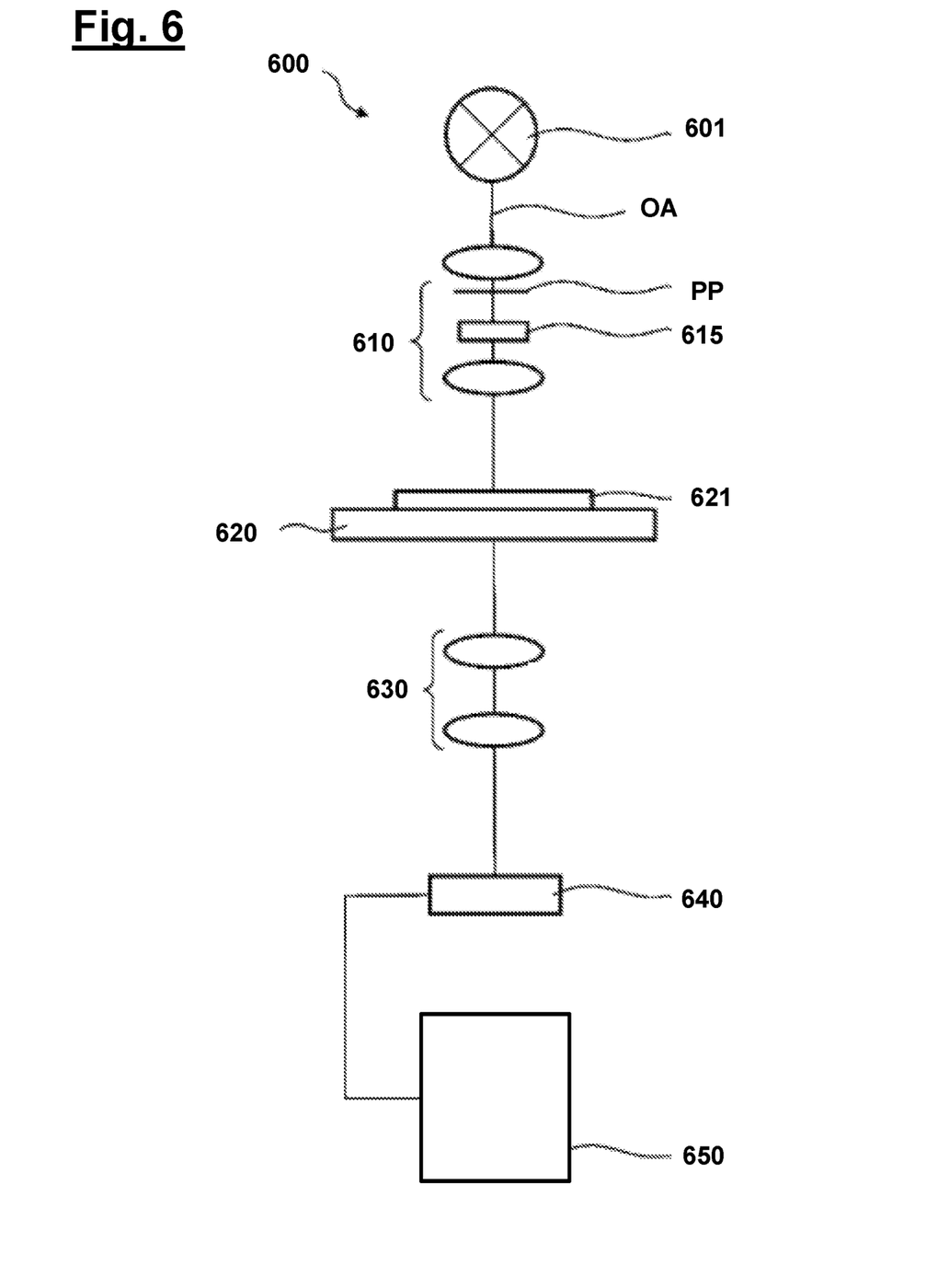
FIG. 6 shows a schematic illustration for elucidating an exemplary construction of a device that can be used in the method according to the invention.

FIG. 6 shows a possible construction of a mask inspection apparatus 600 in which the present invention can be realized.

In accordance with FIG. 6, in a mask inspection apparatus 600, a mask 621 is mounted on a mask holder 620. The structures to be measured on the mask 621 are illuminated with illumination light generated by a light source 601 via an illumination optical unit 610. The illumination optical unit 610 includes a polarizer 615 positioned downstream of a pupil plane PP. Different polarizer configurations can be used to achieve different illumination settings. Light coming from the mask 621 is imaged by an imaging optical unit 630 onto a detector unit 640 and detected. The image data recorded by the detector unit 640 are evaluated in an evaluation unit 650 for determining the position of the structures.

Different embodiments of a method according to the invention for measuring a mask in a mask inspection apparatus (e.g. having the construction shown in FIG. 6) will now be described below with reference to FIG. 1 et seq. What these embodiments have in common in each case is that in the illumination optical unit 610 of the mask inspection apparatus 600, the desired polarized illumination setting predefined for the actual lithography process is not set, for instance, rather a plurality of individual imagings are carried out with mutually different illumination settings.

These illumination settings taken as a basis for the individual imagings are chosen then such that they firstly yield "in sum" the predefined polarized illumination setting of the lithography process, but secondly also each enable by themselves a particularly simple and fast calculation of the associated vector effects which are to be expected or have to be taken into account for the lithography process in the projection exposure apparatus in the case of the polarized illumination setting set there.

Specifically, the polarized illumination setting predefined for the lithography process in all of the embodiments described below is a quasi-tangential illumination setting, wherein the respective intensity distribution may be different depending on the embodiment, as described below.

The illumination settings taken as a basis for the respective individual imagings in the individual embodiments each have a constantly linear polarization distribution and are ascertained by "decomposing" said quasi-tangential illumination setting in such a way that "in sum" or upon superimposition they yield the relevant quasi-tangential illumination setting.

Figure 1A:
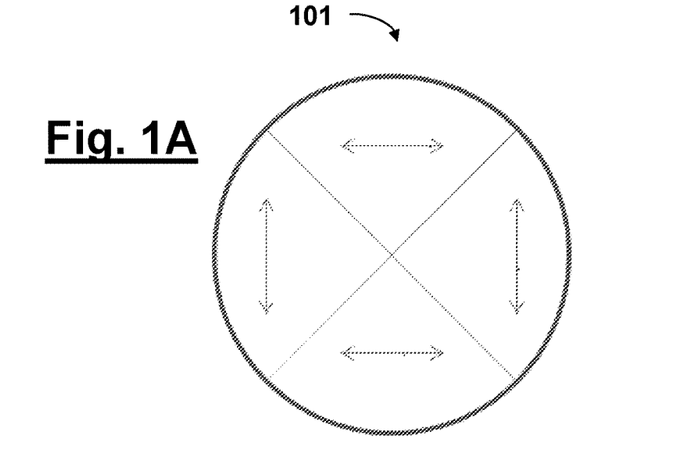
FIGS. 1A-1D, 2A-2D, 3A-3C, 4A-4D and 5A-5C show schematic illustrations for elucidating different embodiments of a method according to the invention.
Figure 1B:
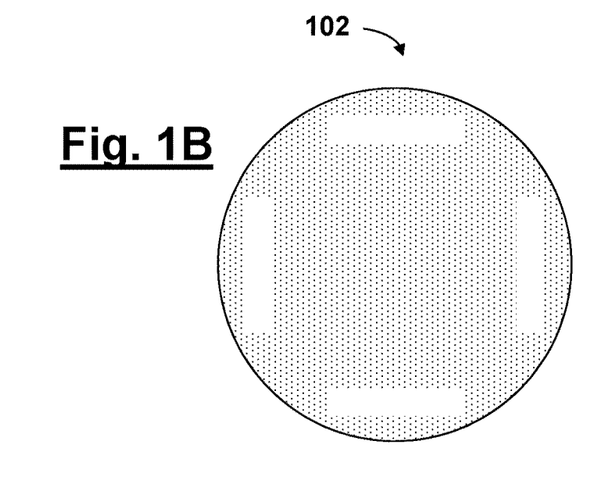

Referring to the exemplary embodiment in accordance with FIGS. 1A-1D, the polarized illumination setting predefined for the lithography process is a quasi-tangential quadrupole illumination setting, for which the polarization distribution 101 is illustrated in FIG. 1A and the intensity distribution 102 is illustrated in FIG. 1B. For example, the shaded regions in FIGS. 1B-1D (as well as 2B-2D, 3B, 3C, and 5A-5C) can represent areas of low or zero illumination intensity, and the white rectangular regions can represent areas of high illumination intensity. The regions having high illumination intensity can have shapes different from those shown in the figures.

A "tangential polarization" (or "TE polarization") is understood to mean a polarization distribution in which the oscillation planes of the electric field strength vectors of the individual linearly polarized light rays are oriented approximately perpendicular to the radius directed at the optical system axis. By contrast, a "radial polarization" (or "TM polarization") is understood to mean a polarization distribution in which the oscillation planes of the electric field strength vectors of the individual linearly polarized light rays are oriented approximately radially to the optical system axis. Accordingly, a quasi-tangential or a quasi-radial polarization distribution is understood to mean a polarization distribution in which the aforementioned criteria are at least approximately satisfied.

Figure 1C:
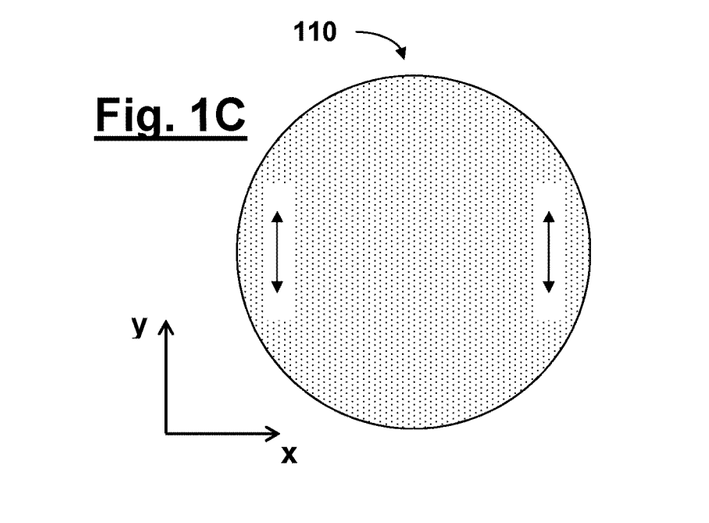
Figure 1D:
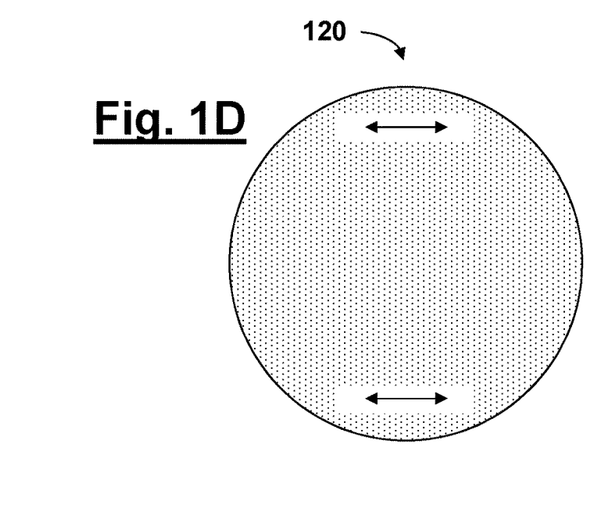

FIGS. 1C and 1D show illumination settings 110, 120 taken as a basis for the individual imagings in accordance with the "decomposition" mentioned above, wherein a dipole setting having illumination poles situated opposite one another in the x-direction with the polarization direction extending in the y-direction is set in a first individual imaging in accordance with FIG. 1C, and a further dipole setting having illumination poles situated opposite one another in the y-direction with the polarization direction extending in the x-direction is set in a second individual imaging in accordance with FIG. 1D. The illumination settings 110, 120 thus firstly yield "in sum" the quasi-tangential quadrupole illumination setting in accordance with FIGS. 1A-1B and secondly, on account of the constantly linear polarization distribution, also enable, in a manner known per se, a fast and simple calculation of the respective vector effects to be taken into account for the lithography process, without this necessitating the use of an additional polarization-optical element in the imaging optical unit 630 from FIG. 6.

The illumination settings taken as a basis for the individual imagings in accordance with FIG. 1C and FIG. 1D can be set using corresponding stops in the illumination optical unit 610 or via an arrangement of individual elements, e.g. individual mirrors, such as a micromirror array, (as known e.g. from DE 10 2013 212 613 B4 and US published patent application 20150001408), that are adjustable independently of one another for setting desired illumination settings. In order to generate the corresponding polarization distribution, it is possible to use any suitable polarization-influencing element which generates the polarization distribution illustrated in FIG. 1C and FIG. 1D, respectively. Alternatively, it is also possible to use a linear polarizer that is rotated by 90° between the two exposures.

After the detection of the measurement images respectively obtained during the individual imagings in accordance with FIGS. 1C-1D in the detector unit 640, firstly according to the method known per se the associated vector effects to be expected in the lithography process are added to the respective image data and then the measurement data correspondingly corrected with regard to the vector effects are added to the overall image. This addition of the image data to the overall image is preferably carried out in an "energy-normalized" manner by carrying out a normalization to the intensity values obtained without a mask structure and ascertained with a suitably positioned detector direction, in order to eliminate optics-specific effects such as, e.g., camera inhomogeneities. In this context, with respect to the prior art, reference is made to EP 1 615 062 B1.

Figure 2A:
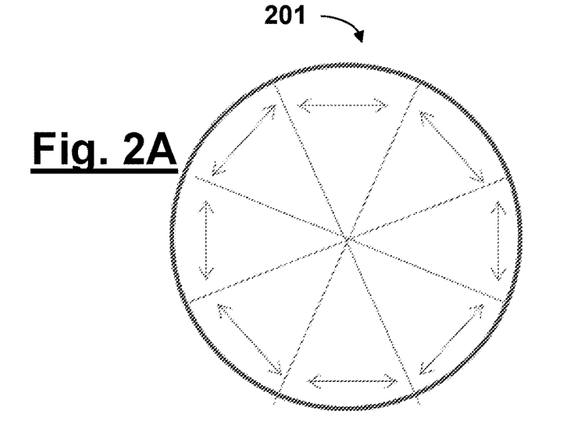
Figure 2B:
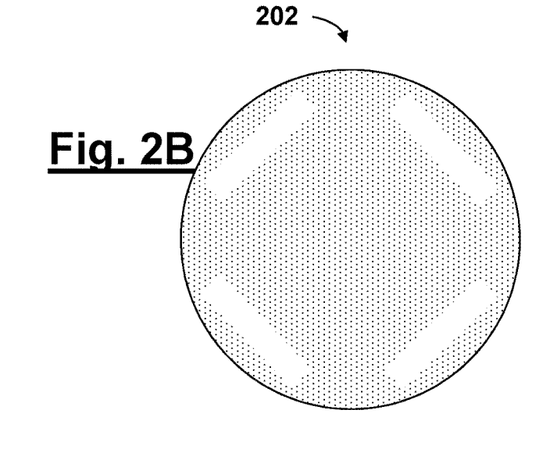
Figure 2C:
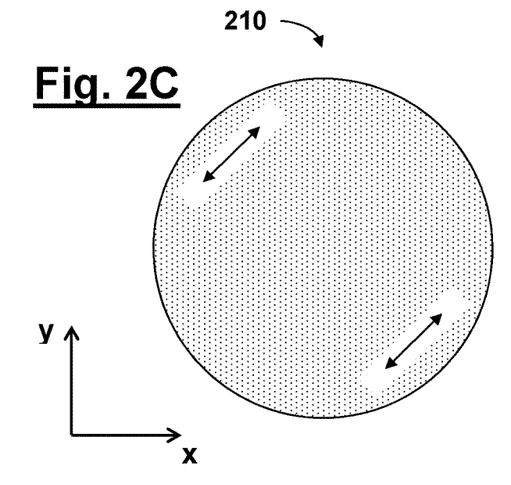
Figure 2D:
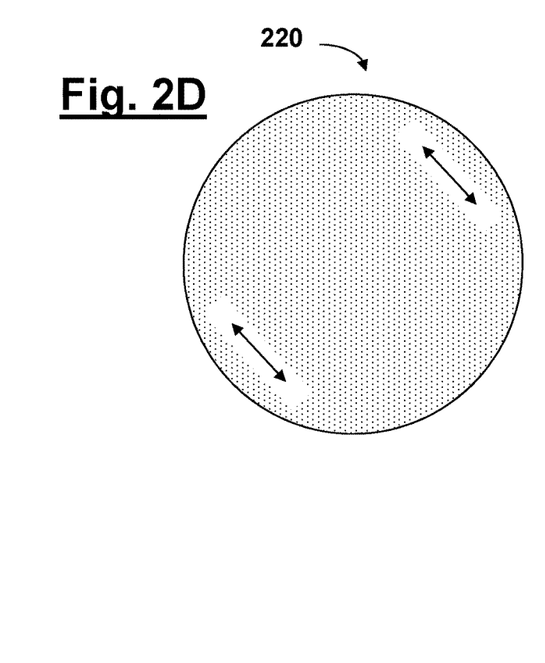

FIGS. 2A-2B show schematic illustrations for elucidating a further embodiment, wherein the polarized illumination setting predefined for the lithography process here is a quasi-tangential quasar illumination setting having illumination poles rotated by an angle of 45° relative to the x- and y-direction, respectively. According to the invention, here then in a manner analogous to the exemplary embodiment in FIGS. 1A-1D, a respective dipole illumination setting 210 and 220 having in each case a constantly linear polarization direction extending at 45° with respect to the x- and y-direction, respectively, is taken as a basis for the individual imagings. In order to generate the corresponding polarization distribution, it is possible to use a suitable polarization-influencing element which generates the polarization distribution 201 illustrated in FIG. 2A. Alternatively, it is also possible to use a linear polarizer that is rotated by 90° between the two exposures, wherein the corresponding illumination poles can be generated via stops or an arrangement comprising elements, e.g. mirrors, that are adjustable independently of one another.

Figure 5A:
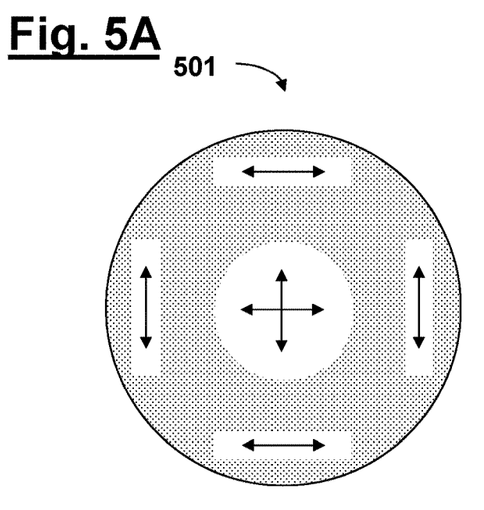
Figure 5B:
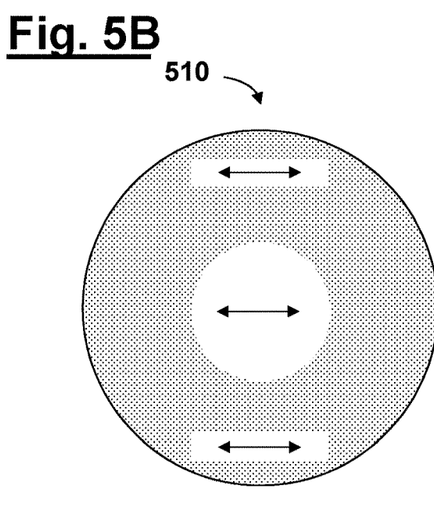
Figure 5C:
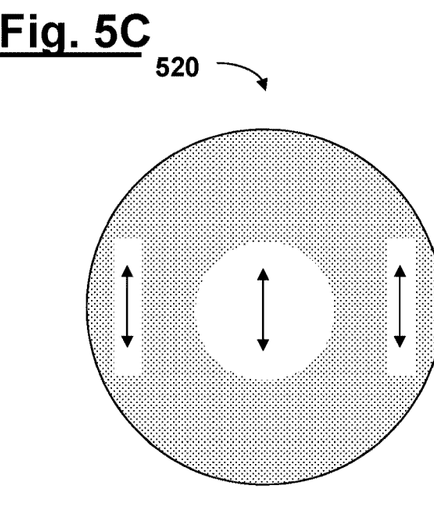

FIGS. 5A-5C show schematic illustrations for elucidating a further embodiment, which differs from the embodiment in FIGS. 1A-D in that the polarized illumination setting predefined for the lithography process additionally contains an unpolarized region or illumination pole (wherein said unpolarized region in accordance with FIG. 5A is positioned merely by way of example in the pupil center).

FIGS. 5B and 5C show the illumination settings 510 and 520, respectively, taken as a basis according to the invention for the individual imagings carried out in the mask inspection apparatus 600. In this case, in accordance with FIG. 5B, in addition to the illumination poles situated opposite one another in the y-direction with the polarization direction extending in the x-direction, also in the region for which unpolarized light is desired in the lithography process a constantly linear polarization distribution with the polarization direction extending in the x-direction is generated (wherein the intensity in this pupil region is reduced to 50% of the value actually required). Analogously, in the illumination setting 520 in FIG. 5C, in addition to the illumination poles situated opposite one another in the x-direction with y-polarization, also in the region for which unpolarized light is desired in the lithography process a constantly linear polarization distribution with the polarization direction extending in the y-direction is generated. This makes use of the fact that upon subsequent addition of the image data (corrected by adding the respective vector effects analogously to the embodiments described above) the superimposition of the regions polarized orthogonally to one another yields unpolarized light as a result.

In embodiments of the invention, the polarized illumination settings with the constantly linear polarization direction that are taken as a basis in each case for the individual imagings according to the invention in accordance with the embodiments described above with reference to FIGS. 1C-1D, FIGS. 2C-2D and FIGS. 5B-5C can be set by a polarizer element that is already designed for generating a quasi-tangential polarization distribution (e.g. the polarization distribution 101 in accordance with FIG. 1A) remaining permanently in the illumination beam path of the illumination optical unit 610, but being illuminated in each case only partially (i.e. only in the illumination poles desired for the individual imagings).

In further embodiments, the polarized illumination settings with the constantly linear polarization direction that are taken as a basis in each case for the individual imagings according to the invention can also be set by a polarizer that is designed in each case for generating a linear starting polarization being correspondingly rotated in the illumination beam path of the illumination optical unit 610.

The invention is not restricted to a setting of the constantly linear polarization direction to be taken as a basis in each case for the individual imagings in the illumination optical unit of the mask inspection apparatus. In this regard, in further embodiments, a constantly linear polarization direction can also be set within the imaging optical unit 630 of the mask inspection apparatus 600 by a corresponding analyzer that allows only the respectively desired polarization direction to pass being introduced into the beam path of the imaging optical unit.

Such a realization can be advantageous in particular in a mask inspection apparatus which does not have the possibility of variably setting the illumination setting via an arrangement comprising elements, e.g. mirrors, that are adjustable independently of one another, wherein the use of displaceable stops in the illumination optical unit can then be dispensed with.

Figure 3A:
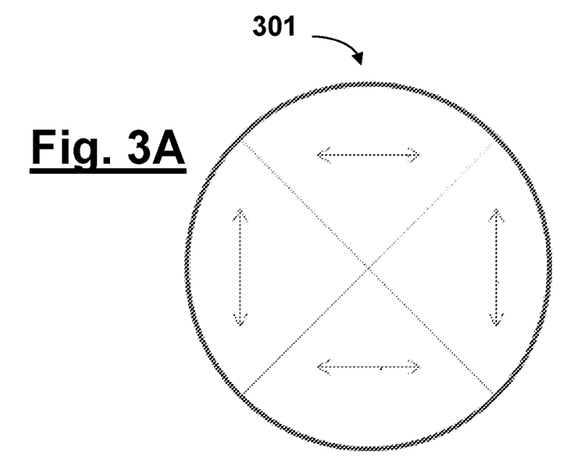
Figure 3B:
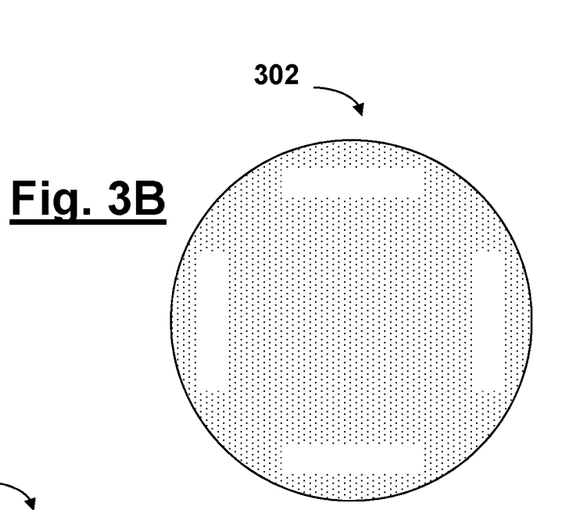
Figure 3C:
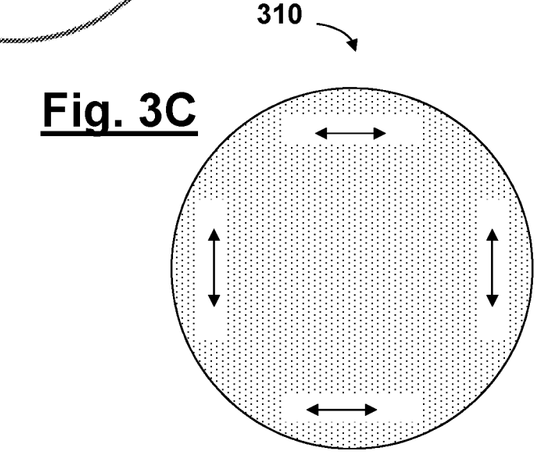

Consequently, instead of changing the illumination setting set for the individual imagings according to the invention in the illumination optical unit, it is also possible to use a polarizer or analyzer in the imaging optical unit 630 in order to achieve the effect that the relevant individual imagings are carried out in each case with only a constantly linear polarization direction. For this purpose, e.g. in accordance with FIG. 3 (in the case of a quasi-tangential quadrupole illumination setting predefined for the lithography process in accordance with FIGS. 3A-3B analogously to the exemplary embodiments in FIGS. 1A-1B and FIGS. 2A-2B) in the illumination optical unit it is possible to choose the illumination setting for the respective individual imagings in an unchanged manner in accordance with FIG. 3C.

Figure 4A:
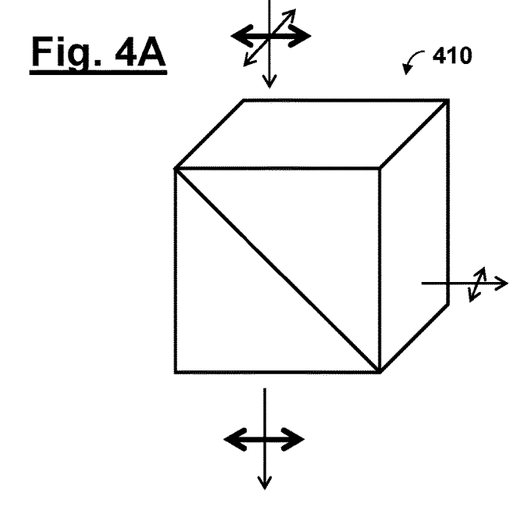
Figure 4B:
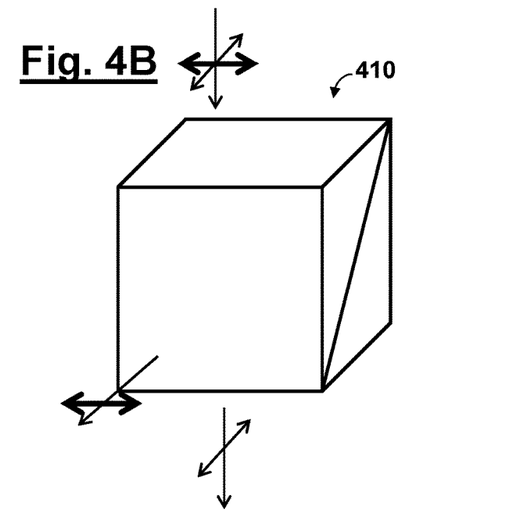
Figure 4C:
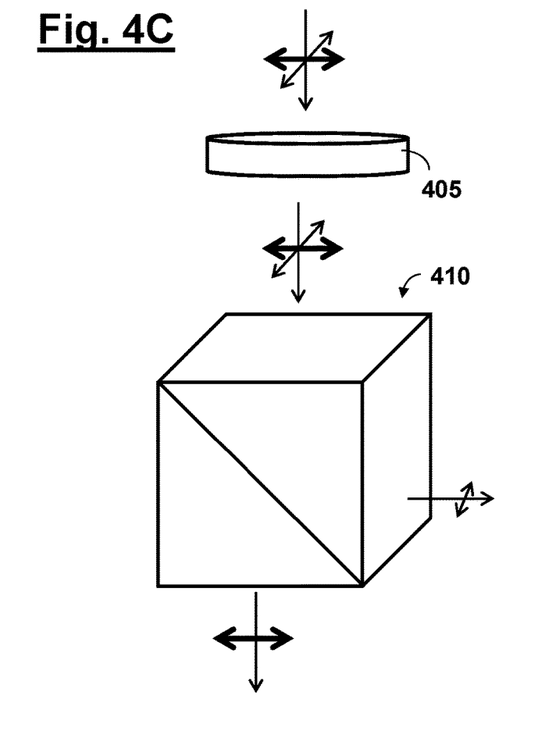
Figure 4D:
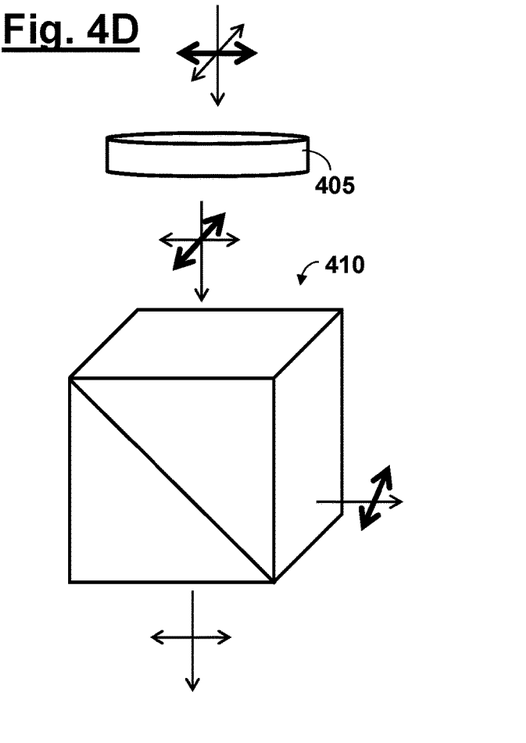

In order to manipulate the polarization in the imaging optical unit 630, in accordance with FIGS. 4A-4B in principle a polarization beam splitter cube 410 can be used and rotated in the beam path depending on the desired linear polarization direction to be set in the imaging optical unit, wherein—as indicated in FIGS. 4A-4B—partial beams with mutually perpendicular polarization directions are respectively directed in mutually different spatial directions. For example, the polarization beam splitter cube 410 can be part of the imaging optical unit 630. FIGS. 4C-4D show schematic illustrations for clarifying a further advantageous configuration, in which a lambda/2 plate 405 is arranged upstream of the polarization beam splitter cube 410 relative to the optical beam path. For example, the lambda/2 plate 405 and the polarization beam splitter cube 410 can be part of the imaging optical unit 630. In this case, the respectively desired polarization direction can be set by rotating the lambda/2 plate 405 (with the polarization beam splitter cube 410 kept fixed) since by this mechanism (as indicated in FIGS. 4C and 4D) the polarization direction is actually rotated prior to entrance into the polarization beam splitter cube 410, such that the polarization direction of the light also varies upon emergence from the polarization beam splitter cube 410.

In this case, the rotation of the lambda/2 plate 405 instead of the polarization beam splitter cube 410 in accordance with FIGS. 4C-4D has the advantage of a comparatively smaller image offset, which in principle is associated with manufacturing-dictated deviations of the relevant optical elements from an exact plane-parallel geometry. Specifically, such an image offset on account of manufacturing-dictated beam deflections is less pronounced in the case of the lambda/2 plate 405 owing to the significantly smaller thickness thereof, such that as a result a higher accuracy is achieved in the setting of the respective polarized illumination setting.

In a further embodiment, it is also possible for a separate detector unit to be assigned to each of the two partial beams emerging from the polarization beam splitter cube 410 in accordance with FIG. 4A, 4B, 4C, or 4D with the consequence that the individual imagings associated with these polarization directions can be carried out and measured simultaneously, as a result of which a further increase in the measurement speed can advantageously be achieved.

Even though the invention has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are concomitantly encompassed by the present invention, and the scope of the invention is restricted only within the meaning of the accompanying patent claims and the equivalents thereof.

What is claimed is:

1. A method for characterizing a mask for microlithography, comprising:
    illuminating structures of a mask intended for use in a lithography process in a microlithographic projection exposure apparatus by an illumination optical unit;
    imaging the mask onto a detector unit by an imaging optical unit;
    evaluating image data recorded by the detector unit in an evaluation unit; and
    emulating a predefined illumination setting that has a quasi-tangential polarization distribution for the lithography process in the microlithographic projection exposure apparatus, including carrying out the imaging of the mask onto the detector unit using a plurality of individual illumination settings set in the illumination optical unit to produce a plurality of individual imagings that differ from one another with regard to the illumination setting set in the illumination optical unit;
    wherein the individual illumination settings each has a constantly linear polarization distribution, and a sum of the individual illumination settings in terms of light distribution and polarization corresponds to the predefined illumination setting that has the quasi-tangential polarization distribution.

2. The method according to claim 1, wherein the illumination setting to be set in the microlithographic projection exposure apparatus is a quadrupole illumination setting or an annular illumination setting.

3. The method according to claim 1, wherein the plurality of individual imagings are carried out without modification of the imaging optical unit.

4. The method according to claim 1, wherein different illumination settings for the individual imagings are set by regions of a polarization-influencing optical element arranged in the illumination optical unit, from which regions light passes to the mask during the respective individual imaging, being chosen to be different from one another for the individual imagings.

5. The method according to claim 1, wherein different illumination settings for the individual imagings are set by exchanging or displacing at least one stop in the illumination optical unit.

6. The method according to claim 1, wherein different illumination settings for the individual imagings are set using a mirror arrangement comprising a multiplicity of mirror elements that can be set independently of one another.

7. The method according to claim 1, wherein during the evaluation of the image data recorded by the detector unit during the individual imagings, a conversion of said image data is carried out in each case, during which conversion said image data are subjected to a polarization-dependent weighting.

8. The method according to claim 7, wherein the image data recorded by the detector unit during the individual imagings, following said conversion, are added, added in weighted fashion, averaged or averaged in weighted fashion.

9. A method for characterizing a mask for microlithography, wherein structures of a mask intended for use in a lithography process in a microlithographic projection exposure apparatus are illuminated by an illumination optical unit and wherein the mask is imaged onto at least one detector unit by an imaging optical unit, wherein image data recorded by the detector unit are evaluated in an evaluation unit,
wherein for emulating an illumination setting predefined for the lithography process in the microlithographic projection exposure apparatus, the imaging of the mask onto the at least one detector unit is carried out using a plurality of individual illumination settings set in the illumination optical unit or a plurality of individual polarization-influencing effects of the imaging optical unit to produce a plurality of individual imagings that differ from one another with regard to the illumination setting set in the illumination optical unit or the polarization-influencing effect of the imaging optical unit;
wherein the illumination setting to be set in the microlithographic projection exposure apparatus has a quasi-tangential polarization distribution;
wherein the individual illumination settings or polarization-influencing effects each has a constantly linear polarization distribution, and a sum of the individual illumination settings or the individual polarization-influencing effects in terms of light distribution and polarization corresponds to the illumination setting to be set in the microlithographic projection exposure apparatus that has the quasi-tangential polarization distribution;
wherein during the evaluation of the image data recorded by the at least one detector unit during the individual imagings, a conversion of said image data is carried out in each case, during which conversion said image data are subjected to a polarization-dependent weighting; and
wherein the image data recorded by the at least one detector unit during the individual imagings, following said conversion, are added, added in weighted fashion, averaged or averaged in weighted fashion.

10. The method according to claim 9, wherein at least two mutually different detector units or at least two different regions of a detector unit are used for recording the image data during the individual imagings.

11. The method according to claim 10, wherein light portions of different polarization properties are recorded simultaneously by at least two mutually different detector units or by at least two different regions of a detector unit.

12. An apparatus for characterizing a mask for microlithography, comprising:
an illumination optical unit for illuminating structures on the mask,
a detector unit,
an imaging optical unit for imaging the mask onto the detector unit, and
an evaluation unit for evaluating the image data recorded by the detector unit, wherein the apparatus is configured to carry out a method for characterizing a mask for microlithography, wherein structures of a mask intended for use in a lithography process in a microlithographic projection exposure apparatus are illuminated by the illumination optical unit and wherein the mask is imaged onto the detector unit by the imaging optical unit, wherein image data recorded by the detector unit are evaluated in the evaluation unit,
wherein for emulating an illumination setting predefined for the lithography process in the microlithographic projection exposure apparatus, the imaging of the mask onto the detector unit is carried out using a plurality of individual illumination settings set in the illumination optical unit to produce a plurality of individual imagings that differ from one another with regard to the illumination setting set in the illumination optical unit,
wherein the illumination setting predefined for the lithography process in the microlithographic projection exposure apparatus has a quasi-tangential polarization distribution, and
wherein the individual illumination settings each has a constantly linear polarization distribution, and a sum of the individual illumination settings in terms of light distribution and polarization corresponds to the illumination setting predefined for the lithography process in the microlithographic projection exposure apparatus that has the quasi-tangential polarization distribution.

13. The apparatus of claim 12 in which the apparatus is configured to characterize a mask for microlithography in which structures of the mask are intended for use in a lithography process in a microlithographic projection exposure apparatus having a quadrupole illumination setting or an annular illumination setting.

14. The apparatus of claim 12 in which the plurality of individual imagings are carried out without modification of the imaging optical unit.

15. The apparatus of claim 12 in which the illumination optical unit comprises a polarization-influencing optical element, and different illumination settings for the individual imagings are set by regions of the polarization-influencing optical element, from which regions light passes to the mask during the respective individual imaging, being chosen to be different from one another for the individual imagings.

16. The apparatus of claim 12 in which different illumination settings for the individual imagings are set by exchanging or displacing at least one stop in the illumination optical unit.

17. The apparatus of claim 12, comprising a mirror arrangement having a multiplicity of mirror elements that can be set independently of one another for configuring different illumination settings for the individual imagings.

18. The apparatus of claim 12 in which the evaluation unit is configured to, during the evaluation of the image data recorded by the detector unit during the individual imagings, convert the image data in each case, during which conversion the image data are subjected to a polarization-dependent weighting.

19. A method for characterizing a mask for microlithography, the method comprising:
   illuminating structures of a mask intended for use in a lithography process in a microlithographic projection exposure apparatus by an illumination optical unit;
   imaging the mask onto a detector unit by an imaging optical unit;
   evaluating image data recorded by the detector unit in an evaluation unit; and
   emulating a predefined illumination setting for the lithography process in the microlithographic projection exposure apparatus, including carrying out the imaging of the mask onto the detector unit using a plurality of individual illumination settings set in the illumination optical unit to produce a plurality of individual imagings that differ from one another with regard to the illumination setting set in the illumination optical unit, in which the individual illumination settings set in the illumination optical unit each has a constantly linear polarization distribution, the constantly linear polarization distribution has at least one region having high illumination intensity and at least one region having low illumination intensity, and a sum of the individual illumination settings in terms of light distribution and polarization corresponds to the predefined illumination setting that has the quasi-tangential polarization distribution.

\* \* \* \* \*

UNITED STATES PATENT AND TRADEMARK OFFICE
CERTIFICATE OF CORRECTION

PATENT NO. : 10,698,318 B2  
APPLICATION NO. : 16/026675  
DATED : June 30, 2020  
INVENTOR(S) : Holger Seitz et al.

Page 1 of 1

It is certified that error appears in the above-identified patent and that said Letters Patent is hereby corrected as shown below:

In the Specification

<u>Column 8</u>  
Line 34, delete "1A-D" and insert -- 1A – 1D --

Signed and Sealed this  
Twenty-seventh Day of October, 2020

Andrei Iancu  
*Director of the United States Patent and Trademark Office*